United States Patent
Tang et al.

(10) Patent No.: US 8,497,651 B2
(45) Date of Patent: Jul. 30, 2013

(54) OPEN PHASE DETECTION SYSTEM AND METHOD FOR THREE-PHASE MOTOR

(75) Inventors: Xiaohua Tang, Guangdong (CN); Zhiyong Du, Guangdong (CN); Yongzhuang Zhou, Guangdong (CN); Cong Xia, Guangdong (CN); Lipin Cheng, Guangdong (CN); Hui Ma, Guangdong (CN)

(73) Assignee: BYD Company Limited, Shenzhen, Guangdong (CN)

( * ) Notice: Subject to any disclaimer, the term of this patent is extended or adjusted under 35 U.S.C. 154(b) by 0 days.

(21) Appl. No.: 13/408,445

(22) Filed: Feb. 29, 2012

(65) Prior Publication Data

US 2012/0217919 A1     Aug. 30, 2012

Related U.S. Application Data

(63) Continuation of application No. PCT/CN2010/076444, filed on Aug. 29, 2010.

(30) Foreign Application Priority Data

Aug. 31, 2009    (CN) .......................... 2009 1 0189812

(51) Int. Cl.
     *G05B 5/00*          (2006.01)
     *H02H 7/08*          (2006.01)
     *H02P 1/04*           (2006.01)
     *H02P 3/00*           (2006.01)

(52) U.S. Cl.
     USPC ............ 318/474; 318/490; 318/798; 318/434

(58) Field of Classification Search
     USPC ............... 318/474, 490, 798, 434; 361/23
     See application file for complete search history.

(56) References Cited

U.S. PATENT DOCUMENTS

| | | | | |
|---|---|---|---|---|
| 5,568,034 | A * | 10/1996 | Huggett et al. | 318/802 |
| 7,719,217 | B2 * | 5/2010 | Yokota et al. | 318/400.21 |
| 7,977,963 | B2 * | 7/2011 | Bae et al. | 324/764.01 |
| 8,040,096 | B2 * | 10/2011 | Taniguchi | 318/490 |

FOREIGN PATENT DOCUMENTS

| | | |
|---|---|---|
| CN | 2034747 | 3/1989 |
| CN | 2149046 | 12/1993 |
| CN | 1085356 | 4/1994 |
| CN | 2196834 | 5/1995 |

(Continued)

OTHER PUBLICATIONS

International Search Report mailed Dec. 2, 2010, for PCT Patent Application No. PCT/CN2010/076444.

(Continued)

*Primary Examiner* — Erick Glass
(74) *Attorney, Agent, or Firm* — Finnegan, Henderson, Farabow, Garrett & Dunner, LLP

(57) ABSTRACT

An open phase detection system and method for a three-phase motor is provided. The open phase detection system comprises: a signal generating unit coupled to the three-phase motor and configured to generate a driving signal for driving the three-phase motor; a detecting unit coupled to the signal generating unit, and configured to detect whether the signal generating unit generates the driving signal and to detect three-phase current values of the three-phase motor; and a determining unit coupled to the detecting unit, and configured to determine whether the three-phase motor has open phase according to the three phase current values detected by the detecting unit when the driving signal is detected.

16 Claims, 5 Drawing Sheets

FOREIGN PATENT DOCUMENTS

| | | |
|---|---|---|
| CN | 1423388 | 6/2003 |
| JP | 2003-302434 | 10/2003 |
| JP | 2005-010066 | 1/2005 |
| JP | 2005-117788 | 4/2005 |
| JP | 2005-304129 | 10/2005 |

OTHER PUBLICATIONS

International Preliminary Report on Patentability issued Mar. 6, 2012, for PCT Patent Application No. PCT/CN2010/076444.

* cited by examiner

OPEN PHASE DETECTION SYSTEM AND METHOD FOR THREE-PHASE MOTOR

CROSS-REFERENCE TO RELATED APPLICATIONS

The present application is a continuation of International Application No. PCT/CN2010/076444, filed on Aug. 29, 2010, which claims the benefit of priority to Chinese Patent Application No. 200910189812.4 filed with the State Intellectual Property Office of P.R. China on Aug. 31, 2009, the entirety of which is hereby incorporated by reference.

BACKGROUND

1. Technical Field

The present disclosure relates to an open phase detection system and method for a three-phase motor.

2. Description of the Related Art

An open phase of a three-phase motor occurs when one phase current out of three-phase alternating currents loaded on a three-phase motor is lacking. During start-up of the motor, an open phase may result in the motor being unable to start, and during normal operation, an open phase may reduce the dynamic performance of the motor. In addition, an open phase may cause short-circuit and burnout of the motor due to high current and over-heating. Therefore, open phase detection of the three-phase alternating currents of the motor is necessary during start-up and normal operation of the motor for proper operation of the motor. At present, detection of an open phase of the three-phase motor is generally realized by detecting a phase difference between the three-phase voltages using a detection circuit. However, the detection circuit may be made up of many different components and have a complex structure.

SUMMARY

The present disclosure is directed to solve at least one of the problems in the prior art.

Accordingly, the present disclosure provides a detection system for a three-phase motor open phase with simplified structure.

According to one embodiment of the present disclosure, an open phase detection system for a three-phase motor comprises: a signal generating unit coupled to the three-phase motor and configured to generate a driving signal for driving the three-phase motor; a detecting unit coupled to the signal generating unit, and configured to detect whether the signal generating unit generates the driving signal and to detect three-phase current values of the three-phase motor; and a determining unit coupled to the detecting unit, and configured to determine whether the three-phase motor has an open phase according to the three phase current values detected by the detecting unit when the driving signal is detected.

According to another embodiment, an open phase detection method for a three-phase motor comprises: detecting whether a driving signal is generated; detecting three phase current values of the three-phase motor when the driving signal is detected; and determining whether the three-phase motor has an open phase according to the detected three phase current values.

The detection system and method according to the present disclosure realizes open phase detection for the motor by having a simplified structure that can detect the three-phase current value.

DETAILED DESCRIPTION

The aforementioned and other aspects, solutions, and advantages of the present invention will become apparent from the following descriptions and corresponding drawings. The embodiments further clarify the present invention and shall not be construed to limit the scope of the present invention.

Figure 1:
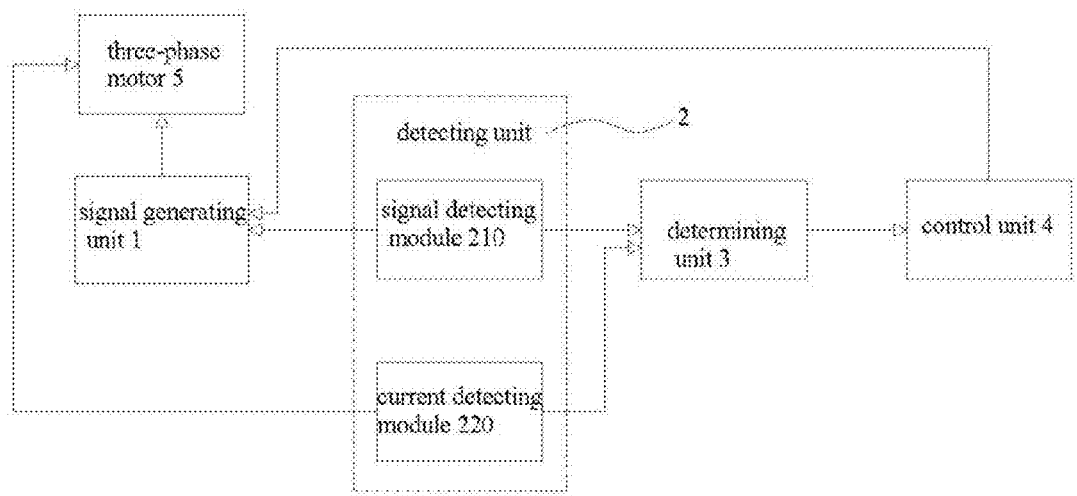
FIG. 1 shows a structural block diagram of the open phase detection system according to an embodiment of the present disclosure.

According to the embodiment shown in FIG. 1, an open phase detection system for a three-phase motor 5 comprises a detecting unit 2, a determining unit 3, a signal generating unit 1, and a control unit 4. The signal generating unit 1 may be electrically coupled with the three-phase motor 5. The detecting unit 2 may be electrically coupled with the signal generating unit 1 and the determining unit 3. The control unit 4 may be electrically coupled with the determining unit 3 and the signal generating unit 1.

The signal generating unit 1 is used to generate a driving signal for driving the three-phase motor 5.

The detecting unit 2 may include: a signal detecting module 210 which is used to detect whether the signal generating unit 1 generates the driving signal; and a current detecting module 220 which is used to detect the three phase current values of the three-phase motor 5.

The determining unit 3 is used to receive the three-phase currents from the detecting unit 2, and to determine whether one of the three-phase current values is zero. When one of the three-phase current values is zero, the three-phase motor 5 is determined to have an open phase.

According to another embodiment, in order to protect the three-phase motor 5 when an open phase occurs, the control unit 4 may control the signal generating unit 1 in order to stop generating the driving signal according to the open phase determination of the determining unit 3.

The open phase detection is performed by controlling the three-phase motor using space vector pulse width modulation (SVPWM) technology. The technical principle of SVPWM is as follows: During the three-phase symmetric sinusoidal wave voltage supply power, a three-phase symmetric motor stator ideal flux circle is used as a reference standard. Different switch modes of a three-phase inverter may be used to make appropriate switching in order to form PWM (pulse width modulation) waves, and an actual flux linkage vector may be formed to trace the accurate flux circle. According to the SVPWM control technology, the different switch modes of a three-phase inverter may divide the 360 degree voltage space into six sectors.

Figure 2:
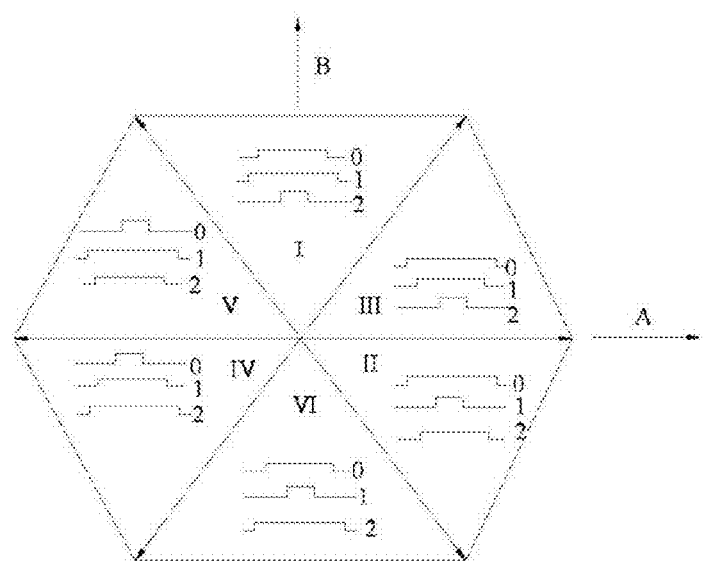
FIG. 2 shows a relationship of the duty ratios of the three-phase currents corresponding to sectors of the present disclosure.

As shown in FIG. 2, sectors I, V, IV, VI, II, and III may be successively defined. The above sectors may be used to determine a rotor position of the three-phase motor. In each sector, 0, 1, and 2 waves correspond to waves of three-phase currents IA, IB, and IC, respectively. With reference to FIG. 2, the duty ratio a1 of A-phase current value IA in sectors I and VI is equal to the duty ratio a2 of B-phase current value IB minus the duty ratio a3 of C-phase current value IC. Meanwhile, the duty ratio a1 of A-phase current value IA is equal to a predetermined duty ratio value a0, and the A-phase current in rushing time is the same as the A-phase current outflowing time, so that the currents are offset and the A-phase current value is zero. Similarly, with reference to FIG. 2, the duty ratio a2 of B-phase current in sectors III and IV is equal to the predetermined duty ratio value a0, i.e. the B-phase current IB in sectors III and IV is zero; and the duty ratio a3 of C-phase current IC in sectors II and V is equal to the predetermined duty ratio value a0, i.e. the C-phase current IC in sectors II and V is zero. In addition, the duty ratio of the predetermined duty ratio value a0 may be about 45%-55%.

In some embodiments, the basic principle of open phase detection for the three-phase motor is as follows: An open phase is determined to occur when a phase current value is zero. However, when the motor is used in a vehicle, and the vehicle is on an ascent and stationary on the slope, the motor will be in operation but has no rotational speed. Subsequently, the motor may be in a condition of locked rotor and a phase current loaded on the motor may be zero. However, the motor does not have an open phase in this situation. An error judgment of such situation may be avoided by determining the sectors and duty ratio.

Figure 3:
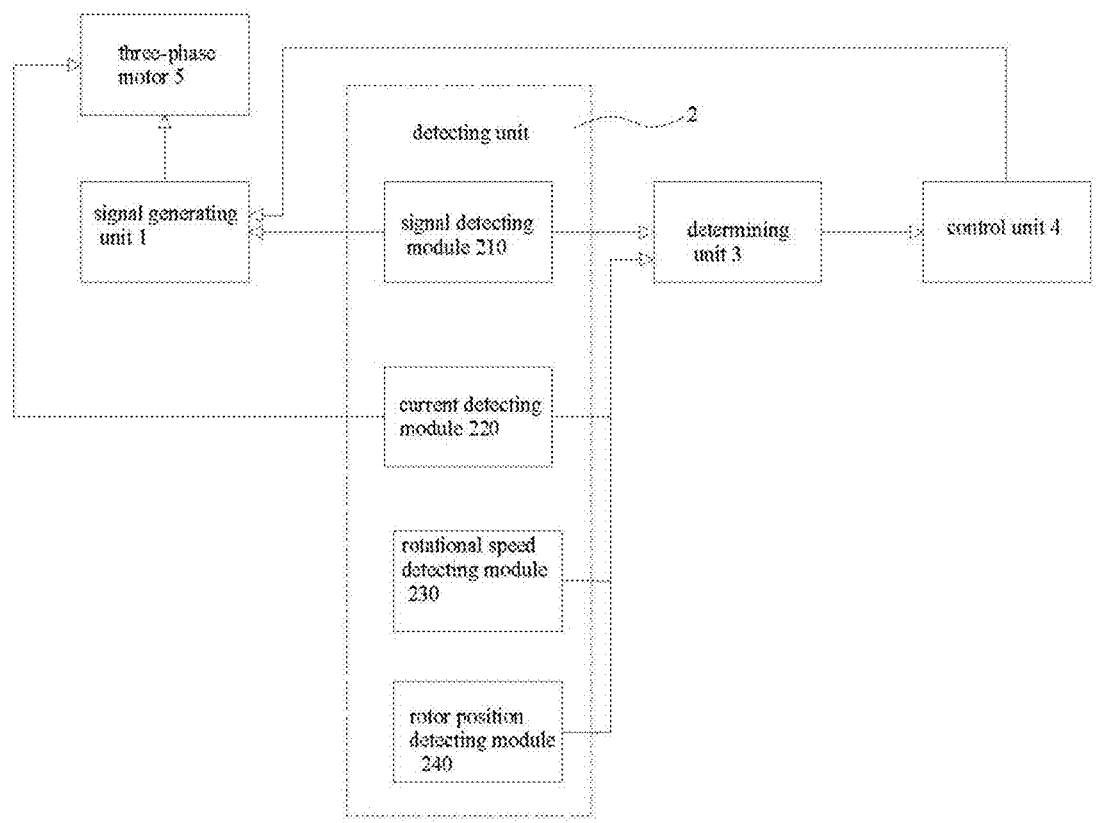
FIG. 3 shows a structural block diagram of the open phase detection system according to another embodiment of the present disclosure.

As shown in FIG. 3, the detecting unit 2 further comprises a rotational speed detection module 230 which is used to detect a rotational speed of a vehicle wheel; and a rotor position detection module 240 which is used to detect a rotor position of the three-phase motor 5. It is only necessary to determine the sector in which the rotor is positioned and the duty ratio of the one phase current to confirm whether the one phase is an open phase, when the rotation speed of the vehicle is zero and one phase current value is zero. The rotor position detection module 240 is used to detect a rotor position of the three-phase motor 5, which includes detecting the sector in which the rotor is positioned, and sending the detection result to the determining unit 3. The rotor position detection module 240 may detect the rotor position by a rotating transformer. When the rotor position is in sectors I and VI and the duty ratio a1 of the A-phase current IA is equal to the predetermined duty ratio value a0, the A-phase of the three-phase motor is not an open phase, even if the A-phase current value IA is zero. Similarly, when the rotor position is in sectors III and IV and the duty ratio a2 of the B-phase current IB is equal to the predetermined duty ratio value a0, the B-phase of the three-phase motor is not an open phase, even if the B-phase current value IB is zero. When the rotor position is in sectors II and V and the duty ratio a3 of the C-phase current IC is equal to the predetermined duty ratio value a0, the C-phase of the three-phase motor is not an open phase, even if the C-phase current value is zero.

In some embodiments, since the three-phase currents loaded on the motor may easily jump, the detecting unit 2 may further comprise a current counter which is used to count the detected currents, a current accumulator, and a current calculator which is used to calculate an average value of the current values, in order to avoid mistakenly determining the situation of an instant current being zero as an open phase fault.

The control unit 4 may control the signal generating unit 1 to stop generating the driving signal each time an open phase is detected, which may reduce the work efficiency of the motor. In order to avoid reducing the work efficiency of the motor, the control unit 4 may further comprise an open phase counter which is used to accumulate the times of open phase and reset the accumulated times according to the determining unit 3. For example, when the times of open phase reaches a set value n1, the motor is determined to have open phase, i.e. when F is equal to 1, the control unit 4 controls the signal generating unit 1 to stop generating the driving signal.

According to other embodiments, the determining unit 3, the signal generating unit 1, and the control unit 4 may be integrated into a piece of chip such as a TMS320F2812DSP chip. The three-phase motor may be a permanent magnet synchronous motor, and the detecting unit 2 may comprise a current sensor and a rotational speed sensor of a vehicle wheel.

The present invention further includes an open phase detection method for a three-phase motor, the method comprising: detecting whether the signal generating unit 1 generates a driving signal; detecting three phase current values of the three-phase motor 5 when the driving signal is detected; and determining whether the three-phase motor 5 has an open phase according to the detected three phase current values by the determining unit 3.

In some embodiments, the open phase detection method may further comprise stopping the generating of the driving signal when the three-phase motor 5 is determined by the determining unit 3 to have an open phase.

Figure 4:
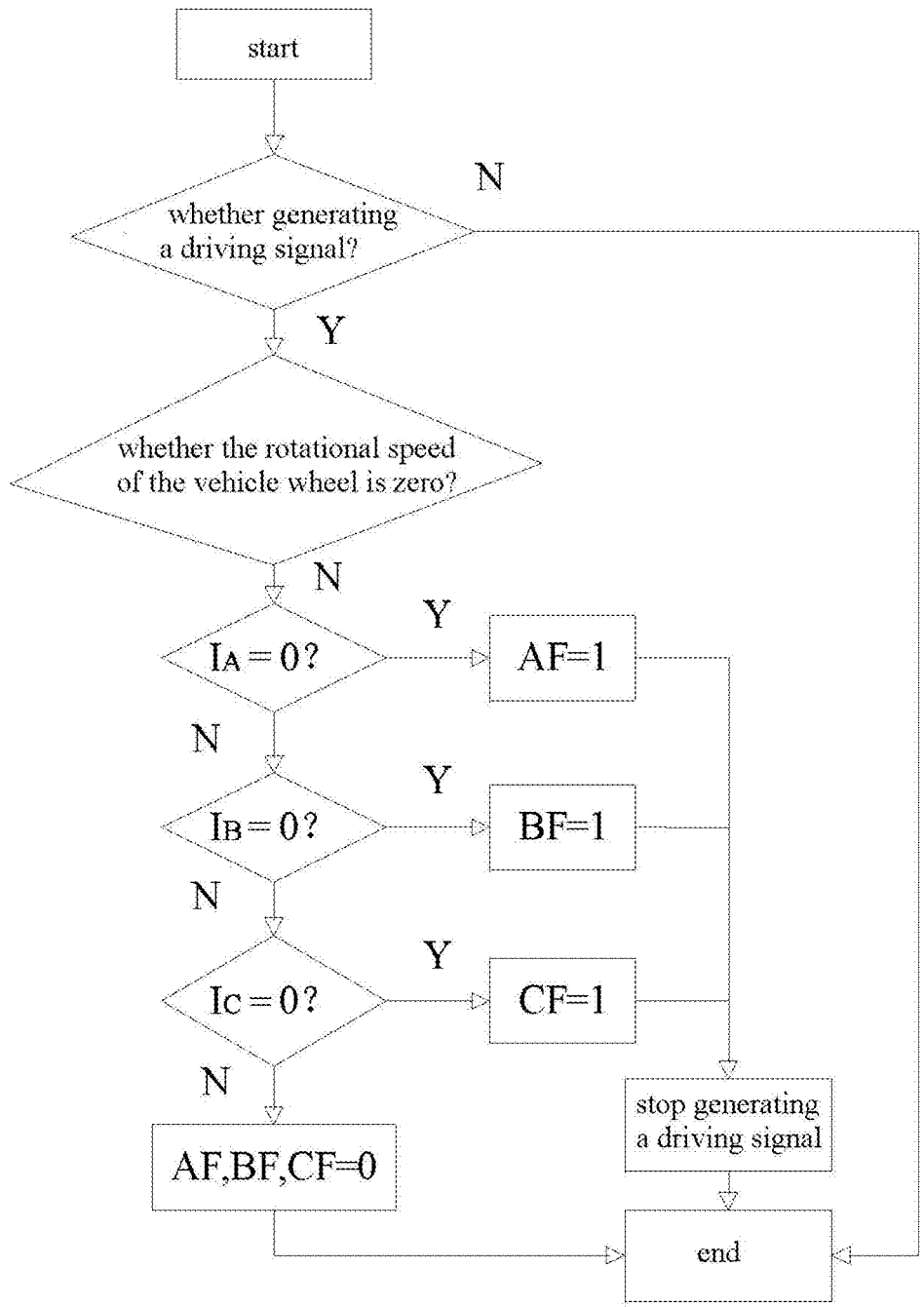
FIG. 4 shows a flow chart of the open phase detection method according to a first embodiment of the present disclosure.

As shown in FIG. 4, a first embodiment of the open phase detection method comprises: detecting whether the signal generating unit 1 generates a driving signal, and terminating the process when the driving signal is not detected; when the driving signal is detected, further detecting whether a rotational speed of a vehicle wheel is zero; and determining whether one of the three phase current values is zero when the rotational speed of the vehicle wheel is not zero.

When none of the phase current values of the three phases is zero, i.e. IA≠0, IB≠0, and IC≠0, the motor is determined to have no open phase, and the process is terminated.

When one phase current value is zero, i.e. IA=0 or IB=0 or IC=0 (AF=1 or BF=1 or CF=1), the motor is determined to have an open phase.

When the open phase is determined by the determining unit 3, the control unit 4 may control the signal generating unit 1 to stop generating the driving signal.

In an open phase detection method of the first embodiment, the three-phase currents may be determined in turn from A-phase to C-phase, or from C-phase to A-phase. The determining order of the three-phase currents may be randomly combined and is not limited to the above. The three-phase motor 5 is determined to have no open phase only when AF, BF, and CF are all equal to zero. If any of AF, BF, or CF is equal to one, the three-phase motor 5 is determined to have an open phase.

Figure 5:
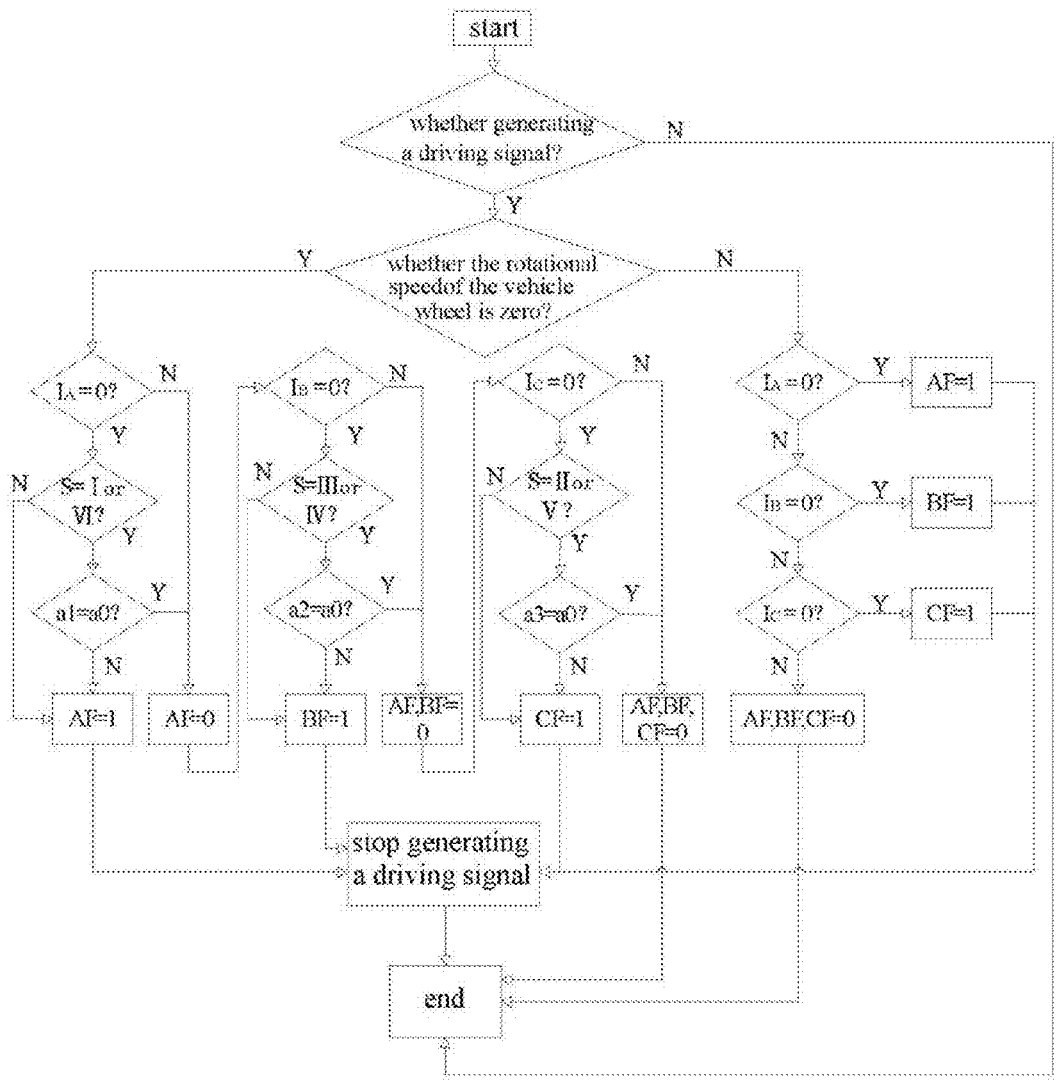
FIG. 5 shows a flow chart of the open phase detection method according to a second embodiment of the present disclosure.

When a vehicle is on an ascent but stationary on the slope, the motor is in operation and has no rotational speed. The motor may be under a condition of locked rotor, and a phase current loaded on the motor may be zero. However, the motor does not have an open phase in this situation. To avoid mistakenly determining that the motor has an open phase in this situation, a second embodiment of an open phase detection method may comprise the following steps, as illustrated in FIG. 5:

when the rotational speed of the vehicle wheel is zero, the determining unit 3 may determine whether the A-phase current value IA is zero;

when the A-phase current value IA is zero, the determining unit 3 may further determine whether the rotor position of the three-phase motor is in sector I or VI;

when the rotor position of the three-phase motor 5 is not in sector I or VI, the motor is determined to have open phase, i.e. AF=1, and the control unit 4 may control signal generating unit 1 to stop generating a driving signal;

when the rotor position of the three-phase motor 5 is in sector I or VI, it is further determined whether a duty ratio a1 of the A-phase current is equal to a predetermined duty ratio value a0;

if the duty ratio a1 of the A-phase current is not equal to the predetermined duty ratio value a0, the motor is determined to have an open phase, i.e. AF=1, and the control unit 4 may control signal generating unit 1 to stop generating a driving signal;

if the duty ratio a1 of the A-phase current is equal to the predetermined duty ratio value a0, it is determined that the A-phase is not open phase, i.e. AF=0;

when the A-phase current value is not zero, it is determined that the A-phase is not open phase, i.e. AF=0;

when AF=0, it is determined whether the B-phase current value is zero;

when the B-phase current value is zero, the determining unit 3 determines whether the rotor position of the three-phase motor 5 is in sector III or IV;

if the rotor position of the three-phase motor is not in sector III or IV, the motor is determined to have open phase, i.e. BF=1, and the control unit 4 may control signal generating unit 1 to stop generating a driving signal;

when the rotor position of the three-phase motor 5 is in sector III or IV, it is further determined whether a duty ratio a2 of the B-phase current IB is equal to the predetermined duty ratio value a0;

if the duty ratio a2 of the B-phase current IB is not equal to the predetermined duty ratio value a0, the motor is determined to have open phase, i.e. BF=1, and the control unit 4 may control signal generating unit 1 to stop generating a driving signal;

when the duty ratio a2 of the B-phase current IB is equal to the predetermined duty ratio value a0, it is determined that the A-phase and B-phase are not open phase, i.e. AF=0 and BF=0; when AF=0 and BF=0, it is further determined whether the C-phase current is zero;

when the C-phase current value IC is not zero, the motor is determined to have no open phase, i.e. AF=0, BF=0 and CF=0, and the process is terminated;

when the C-phase current value IC is zero, the determining unit 3 further determines whether the rotor position of the three-phase motor 5 is in sector II or V;

if the rotor position of the three-phase motor is not in sector II or V, the motor is determined to have an open phase, i.e. CF=1, the control unit 4 may control signal generating unit 1 to stop generating the driving signal;

when the rotor position of the three-phase motor 5 is in sector II or V, it is further determined whether a duty ratio a3 of the C-phase current IC is equal to the predetermined duty ratio value a0;

if the duty ratio a3 of C-phase current IC is equal to the predetermined duty ratio value a0, the motor is determined to have no open phase, i.e. AF=0, BF=0, and CF=0, and the process is terminated; and when the duty ratio a3 of the C-phase current IC is not equal to the predetermined duty ratio value a0, the motor is determined to have an open phase, i.e. CF=1, and the control unit 4 may control signal generating unit 1 to stop generating a driving signal.

Figure 6:
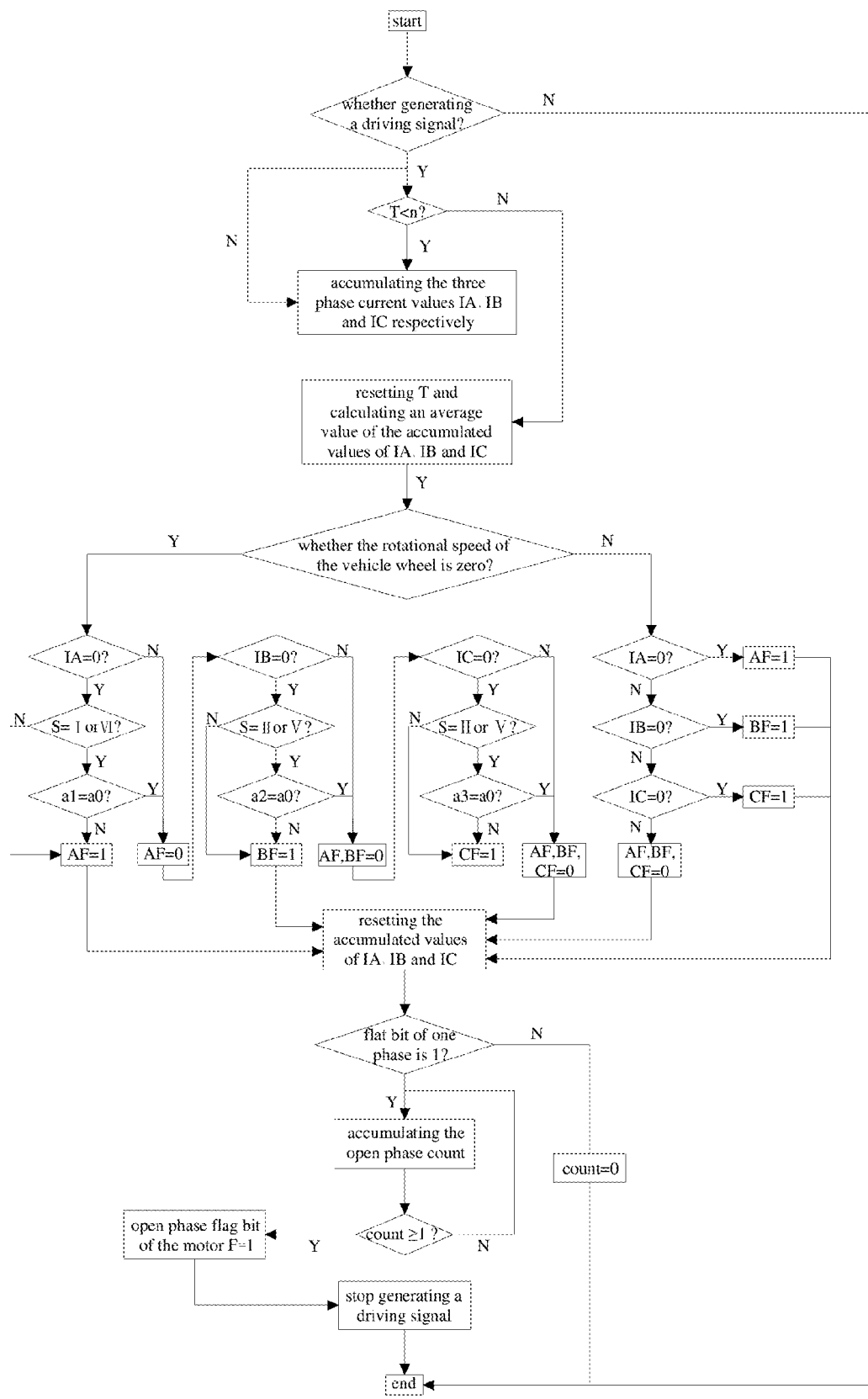
FIG. 6 shows a flow chart of the open phase detection method according to a third embodiment of the present disclosure.

Because the three-phase currents loaded on the motor may easily jump, the situation of an instant current being zero may be mistakenly determined as the motor having an open phase, and the work efficiency of the motor may be reduced. FIG. 6 illustrates a third embodiment to circumvent the above issues after the generating unit 1 generates a driving signal. Accordingly, the open phase detection method according to the third embodiment further comprises:

when the detecting unit 2 detects the driving signal, it is further determined whether times T of currents detected by the current counter of the three-phase currents is smaller than a preset value n;

if times T is smaller than the preset value n, the current accumulator may accumulate the three-phase currents IA, IB, and IC, successively;

if times T is larger than or equal to the preset value n, times T of the three-phase current is reset, and an average value of the accumulated values of IA, IB, and IC, and the average value may be used in subsequent open phase determination.

Because an open phase does not frequently occur, the process of open phase determination may become too complex if the process is frequently performed. Therefore, it is not suitable that the preset value n is too small. However, in order to avoid a mistaken determination arising from a jump of the current, the preset value n should not be too large. Therefore, the preset value n should be about 1000 to 10000.

After detecting whether the three-phase currents IA, IB, and IC are open phases, the above open phase detection method may further comprise:

when the three phases are open phases, all the accumulated three-phase current values IA, IB and IC are reset, and it is further determined whether the flag bit of one of the three-phase currents is 1;

when the flag bits of the three-phase currents are all zero, i.e. AF=0, BF=0, and CF=0, the open phase counter count is equal to 0, and the process is terminated;

when the flag bit of one of the three-phase currents is 1, i.e. AF=1 or BF=1 or CF=1, the open phase counter count may begin to accumulate; and when count is larger than the set value n1, and the total flag bit F=1, the control unit 4 may control signal generating unit 1 to stop generating the driving signal, and the process is terminated.

The above set value n1 is in the range of about 10000 to about 120000, i.e. the control unit 4 may control the signal generating unit 1 to stop generating the driving signal only if successive open phase times of the three-phase currents is about 10000 to about 120000. The successive open phase times of the three-phase currents being about 10000 to about 120000 is acceptable and there will be no damage to the motor. If the open phase counter count does not reach the set value n1, when the flag bits of the three-phase current are all zero, the open phase counter count is reset, i.e. the open phase counter count is equal to 0.

The open phase detection method according to the above third embodiment further comprises calculating an average value of currents and accumulating the open phase times.

Although explanatory embodiments have been shown and described, it would be appreciated by those skilled in the art that changes, alternatives, and modifications can be made in the embodiments without departing from the spirit and principles of the invention. Such changes, alternatives, and modifications all fall into the scope of the claims and their equivalents.

What is claimed is:

1. An open phase detection system for a three-phase motor, the system comprising:
   a signal generating unit coupled to the three-phase motor and configured to generate a driving signal for driving the three-phase motor;
   a detecting unit coupled to the signal generating unit, and configured to detect whether the signal generating unit generates the driving signal and to detect three-phase current values of the three-phase motor; and
   a determining unit coupled to the detecting unit, and configured to determine: whether the three-phase motor has an open phase according to the three phase current values detected by the detecting unit when the driving signal is detected; whether the three-phase motor has an open phase according to a rotational speed of the vehicle wheel; a rotor position of the three-phase motor; a predetermined duty ratio value a0 of the three-phase motor; and the detected three-phase current values.

2. The system according to claim 1, further comprising:
   a control unit coupled to the signal generating unit and the determining unit, and configured to control the signal generating unit to stop generating the driving signal if an open phase is detected.

3. The system according to claim 1, wherein the detecting unit comprises:
   a signal detecting module configured to detect whether the signal generating unit generates the driving signal; and
   a current detecting module configured to detect the three phase current values of the three-phase motor.

4. The system according to claim 3, wherein the detecting unit further comprises:
   a rotational speed detecting module configured to detect the rotational speed of a vehicle wheel; and
   a rotor position detecting module configured to detect the rotor position of the three-phase motor.

5. The system according to claim 4, wherein the detecting unit further comprises:
   a current counter configured to count detected currents;
   a current accumulator configured to accumulate each of the three-phase current values; and
   a current calculator configured to compute an average value of the accumulated three-phase current values.

6. The system according to claim 4, wherein the control unit further comprises an open phase counter configured to accumulate times of the open phase.

7. The system according to claim 6, wherein the control unit is further configured to reset the current accumulator according to a determination result from the determining unit.

8. The system according to claim 3, wherein the determining unit, the signal generating unit, and the control unit may be integrated on a semiconductor chip.

9. An open phase detection method for a three-phase motor, the method comprising:
   detecting whether a driving signal is generated;
   detecting three phase current values of the three-phase motor when the driving signal is detected;
   determining whether the three-phase motor has an open phase according to the detected three phase current values and determining that the three-phase motor has an open phase when one of the three phase current values is zero;
   detecting whether a rotational speed of a vehicle wheel is zero when the driving signal is detected; and
   determining whether one of the three-phase current values is zero when the rotational speed of a vehicle wheel is not zero.

10. The method according to claim 9, further comprising:
    stopping generation of the driving signal when the three-phase motor is determined to have an open phase.

11. The method according to claim 9, further comprising:
    determining: whether the three-phase motor has an open phase according to the rotational speed of the vehicle wheel; a rotor position of the three-phase motor; a predetermined duty ratio value of the three-phase motor; and the three-phase current values.

12. The method according to claim 11, further comprising:
    determining whether an A-phase current value is zero when the rotational speed of the vehicle wheel is zero;
    determining whether the rotor position of the three-phase motor is in sector I or VI when the A-phase current value is zero;
    determining that the three-phase motor has an open phase if the rotor position of the three-phase motor is not in sector I or VI;
    determining whether a duty ratio a1 of the A-phase current is equal to the predetermined duty ratio value a0 when the rotor position of the three-phase motor is in sector I or VI;
    determining that an A-phase of the motor is not an open phase if the duty ratio a1 of A-phase current is equal to the predetermined duty ratio value a0;
    determining that the three-phase motor has an open phase when the duty ratio a1 of the A-phase current is not equal to the predetermined duty ratio value a0;
    determining whether a B-phase current value is zero when the A-phase is not an open phase;
    determining whether the rotor position of the three-phase motor is in sector III or IV when the B-phase current value is zero;
    determining that the three-phase motor has an open phase if the rotor position of the three-phase motor is not in sector III or IV;
    determining whether a duty ratio a2 of the B-phase current is equal to the predetermined duty ratio value a0 when the rotor position of the three-phase motor is in sector III or IV;
    determining that the A-phase and B-phase of the motor are not open phases if the duty ratio a2 of the B-phase current is equal to the predetermined duty ratio value a0;
    determining that the three-phase motor has an open phase when the duty ratio a2 of the B-phase current is not equal to the predetermined duty ratio value a0;
    determining whether a C-phase current value is zero when the A-phase and B-phase are not open phases;
    determining whether the rotor position of the three-phase motor is in sector II or V when the C-phase current value is zero;
    determining that the three-phase motor has an open phase if the rotor position of the three-phase motor is not in sector II or V;
    determining whether a duty ratio a3 of the C-phase current is equal to the predetermined duty ratio value a0 when the rotor position of the three-phase motor is in sector II or V;
    determining that the three-phase motor has no open phase if the duty ratio a3 of the C-phase current is equal to the predetermined duty ratio value a0; and
    determining that the three-phase motor has an open phase when the duty ratio a3 of the C-phase current is not equal to the predetermined duty ratio value a0.

13. The method according to claim 11, further comprising:
   determining whether times T of the detected three phase currents is smaller than a preset value n when the driving signal is detected;
   accumulating the three phase current values IA, IB, and IC successively, if times T is smaller than the preset value n; and
   resetting times T and calculating an average value of the accumulated values of IA, IB, and IC if times T is larger than or equal to the preset value n.

14. The method according to claim 13, wherein the preset value n is in a range of about 1000 to about 10000.

15. The method according to claim 13, further comprising:
   resetting the accumulated values of the three phase current values IA, IB, and IC;
   determining whether flag bit of one of the three phase currents is 1;
   resetting an open phase count and terminating operation if the flag bit of each of the three-phase currents is zero; and
   accumulating the open phase count when the flag bit of one of the three phase currents is 1, setting open phase flag bit F of the motor to 1 when the open phase count is larger than or equal to a set value n1, and stopping generating of the driving signal.

16. The method according to claim 15, wherein the set value n1 is in a range of about 10000 to about 120000.

\* \* \* \* \*